United States Patent
De Laurentiis et al.

(10) Patent No.: US 8,305,117 B2
(45) Date of Patent: Nov. 6, 2012

(54) MULTIPHASE SIGNAL DIVIDER

(75) Inventors: Pierpaolo De Laurentiis, Gessate (IT); Alberto Ferrara, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 186 days.

(21) Appl. No.: 12/787,008

(22) Filed: May 25, 2010

(65) Prior Publication Data
US 2010/0301906 A1 Dec. 2, 2010

(30) Foreign Application Priority Data
May 29, 2009 (IT) .............................. MI2009A0954

(51) Int. Cl.
*H03B 19/00* (2006.01)
(52) U.S. Cl. ......... 327/120; 327/115; 327/117; 327/118
(58) Field of Classification Search .................. 327/115, 327/116, 117, 118, 355–361, 202, 203, 208–212, 327/218; 377/47, 48
See application file for complete search history.

(56) References Cited

U.S. PATENT DOCUMENTS

| | | | | |
|---|---|---|---|---|
| 5,506,532 | A * | 4/1996 | Milazzo | 327/175 |
| 6,380,774 | B2 * | 4/2002 | Saeki | 327/119 |
| 6,392,462 | B2 * | 5/2002 | Ebuchi et al. | 327/295 |
| 7,323,913 | B1 | 1/2008 | Kossel | |
| 2001/0030565 | A1 | 10/2001 | Ebuchi et al. | |
| 2002/0136341 | A1 * | 9/2002 | Huh et al. | 375/376 |
| 2008/0164917 | A1 * | 7/2008 | Floyd et al. | 327/117 |
| 2009/0207671 | A1 * | 8/2009 | Yu et al. | 365/189.07 |
| 2010/0207671 | A1 * | 8/2010 | Hsiao et al. | 327/115 |
| 2010/0295584 | A1 * | 11/2010 | Sano | 327/145 |

FOREIGN PATENT DOCUMENTS
JP 200456717 * 2/2004
* cited by examiner

*Primary Examiner* — Lincoln Donovan
*Assistant Examiner* — Brandon S Cole
(74) *Attorney, Agent, or Firm* — Seed IP Law Group PLLC

(57) ABSTRACT

A divider of an input multiphase signal by a given division factor so as to obtain an output multiphase signal, the divider having a circuit adapted to divide a first signal component of an input multiphase signal by an given division factor to obtain a first component of a output multiphase signal, and a plurality of N−1 devices including a first device adapted to sample the first component with a component of the input multiphase signal to obtain the component of the output multiphase signal corresponding to the one component of the input multiphase signal. Every other device of the plurality of N−1 devices is adapted to sample the component of the output multiphase signal of the preceding device with another component of the input multiphase signal, phase shifted by a further constant factor to obtain the corresponding component of the output multiphase signal.

14 Claims, 4 Drawing Sheets

MULTIPHASE SIGNAL DIVIDER

BACKGROUND

1. Technical Field

The present disclosure relates to a multiphase signal divider.

2. Description of the Related Art

A multiphase signal refers to a set of signals having a waveform, for example sinusoidal or square wave, wherein the individual components of the multiphase signal, i.e., the individual signals it is comprised of, are constantly phase shifted to one another and show a monotonic phase increase when passing from one signal to the next signal. A typical example of a multiphase signal generator is a loop oscillator used, for example, as a voltage controlled oscillator or VCO in a phase locked loop or PLL. The loop oscillator comprises a loop of N identical delay cells, every cell having a determined delay Td. The oscillation frequency is given by $fosc=\frac{1}{2} \ast N \ast Td$. If every output of the delay cell is taken to the output of the VCO, the loop oscillator provides N output signals, every signal oscillating at the fosc frequency but each having a phase difference $2\pi/N$ with respect to the closest signal. The multiphase signal comprises the set of N signal where the phase of every single signal monotonically increases by an equal space of $2\pi/N$ when passing from a signal to the next one. The phase difference between the individual signals of the multiphase signal may be expressed by T/N where T is the period of the multiphase signal.

The multiphase signals are often used in receivers having a serial interface in order to provide the sampling phases required for the latches that sample the received serial data.

In communication schemes, phase locked loops or PLLs are often employed on which the architectures of transmitters and receivers are based.

In U.S. Pat. No. 7,323,913, a multiphase divider is described for a serial connection receiver based on a PLL with a phase rotating device (also P-PLL). The phase locked loop or PLL includes a voltage controlled oscillator or VCO adapted to generate a multiphase signal, a multiphase signal divider, a phase rotating device having at the input the signals at the output of the phase divider and a reference signal and being adapted to generate a control signal of the VCO oscillator. The multiphase divider has a plurality of resettable dividers configured so as to achieve resettable division stages for a plurality of multiphase signals forming a plurality of divided multiphase signals having a monotonic phase increase with equal space and an ideal duty cycle of 50%, where the plurality of the divided multiphase signals has not any phase ambiguity. The multiphase divider includes a reset signal generator designed to provide a plurality of periodical reset signals to the plurality of resettable dividers in order to enable the plurality of resettable dividers to divide the plurality of multiphase signals in a correct time sequence to form the divided multiphase signals. The plurality of periodical reset signals is yielded by means of a combination network of the reset signal generator. The combination network is designed to generate a number of pulses based on the plurality of multiphase signals, thus achieving a plurality of decimation stages and where the periodical reset signals are generated in response to the plurality of multiphase signals.

A communication system with transmitter and receiver where the receiver includes the abovementioned multiphase divider will exhibit a higher circuital complexity due to the presence of the reset signal generator. In addition, the use of reset signals does not allow the system to be fast as resetting the divider stages of the multiphase divider is needed.

BRIEF SUMMARY

In view of the state of the art, the present disclosure provides a multiphase signal divider that does not use reset signals.

In accordance with one aspect of the present disclosure, a divider of an input multiphase signal by a given division factor is provided that generates an output multiphase signal, the input multiphase signal having a plurality of N signal components, with N integer number and different from zero. At a first frequency and where every signal component of the plurality of signal components is phase shifted either with respect to the preceding component or the following component of the plurality by a constant factor, the output multiphase signal comprising a plurality of N signal components corresponding to the components of the input multiphase signal but at a second frequency given by the first frequency divided by the division factor and where every signal component of the plurality of signal components is phase shifted either with respect to the preceding component or the following component of the plurality by the constant factor, the divider having a circuit adapted to divide the first component of the input multiphase signal by the given division factor, thus obtaining the first component of the output multiphase signal and a plurality of N−1 devices. The first device of the plurality of N−1 devices being adapted to sample the first component of the output multiphase signal with a component of the input multiphase signal, thus obtaining the component of the output multiphase signal corresponding to the one component of the input multiphase signal, every other device of the plurality of N−1 devices is adapted to sample the component of the output multiphase signal of the preceding device with another component of the input multiphase signal, phase shifted by a further constant factor with respect to the component of the input multiphase signal used in the preceding device, thus obtaining another component of the output multiphase signal corresponding to the other component of the input multiphase signal.

In accordance with another aspect of the present disclosure, a circuit is provided that includes a multiphase signal divider having an input to receive a multiphase input signal and adapted to output a multiphase output signal, the multiphase input signal comprised of a plurality of individual signal components, the divider structured to phase shift each individual signal component relative to the other individual signal components, the multiphase output signal formed of the plurality of phase shifted individual signal components having equal waveforms shifted by a monotonic phase shift of a constant factor.

In accordance with another aspect of the foregoing embodiment, the divider is adapted to divide a first signal of the plurality of individual signal components in the multiphase input signal by a constant K to obtain a first signal of the plurality of signals forming the multiphase output signal, the divider further comprising a plurality of flip flops adapted to sample the plurality of phase shifted individual signal components, and every other flip flop of the plurality of flip flops adapted to sample a respective one of the plurality of phase shifted individual signal components from a respective preceding flip flop and to phase shift the same by a further constant factor with respect to the individual signal component of the corresponding multiphase input signal in the preceding flip flop to obtain another phase shifted individual signal component.

BRIEF DESCRIPTION OF THE SEVERAL VIEWS OF THE DRAWINGS

The features and advantages of the present disclosure will be apparent from the following detailed description of a practical embodiment thereof, shown by way of non-limiting example in the accompanying drawings, in which.

DETAILED DESCRIPTION

Figure 1:
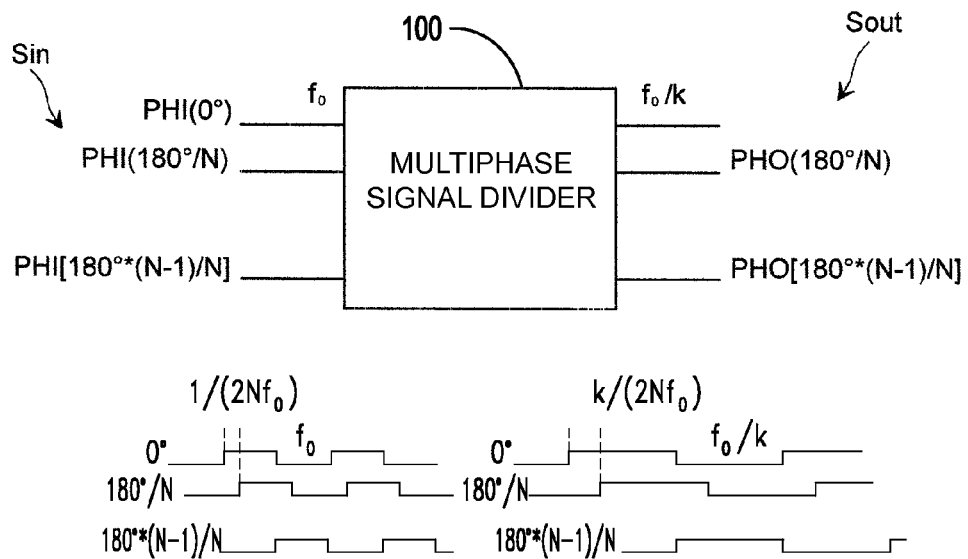
FIG. 1 illustrates a multiphase signal divider in accordance with the present disclosure.

With reference to FIG. 1, a multiphase signal divider 100 is shown in accordance with an embodiment of the present disclosure. The multiphase signal Sin includes a plurality of n signals PHI of frequency $f_o$ of waveform, for example sinusoidal or square wave, in which the individual signal components of the multiphase signal, i.e., the individual signals PHI, are constantly phase shifted to one another and show a monotonic phase increase by a constant factor when passing from one signal to the next signal of the plurality. In particular, the multiphase signal Sin has a plurality of n signals PHI (0°), PHI(180°/N) . . . PHI(180°(N−1)/N) where, if N=6 for example, there is a phase shifting by 30° between a signal of the sequence and the following or preceding signal.

The signal Sout at the output of the divider 100 is a multiphase signal having a plurality of N signals PHO of frequency $f_o/K$, i.e., the signals PHO(0°), PHO(180°/N) . . . PHO(180°(N−1)/N) having waveforms equal to the previous ones but with different frequency; the components of signal Sout correspond to the components of signal Sin, differ by the different frequency $f_o/K$ and are constantly phase shifted to one another and show a monotonic phase increase by a constant factor when passing from a signal to the next signal of the plurality.

The divider 100 includes a first circuit 1 adapted to divide the first signal PHI(0°) of the plurality of signals that form the multiphase signal Sin by a constant K obtaining the signal $PHO_0$=PHO(0°) which is the first signal of the plurality of signals forming the output multiphase signal Sout.

The divider 100 has a plurality of N−1 devices, preferably flip-flops of the toggle type. The first device of the plurality of N−1 devices is adapted to sample the first component of the output multiphase signal with a component of the input multiphase signal, thus obtaining the component of the output multiphase signal corresponding to the one component of the input multiphase signal. Every other device of the plurality of N−1 devices is adapted to sample the component of the output multiphase signal from the preceding device with another component of the input multiphase signal, phased shifted by a further constant factor with respect to the component of the input multiphase signal used in the preceding device, thus obtaining another component of the output multiphase signal corresponding to the other component of the input multiphase signal.

Figure 2:
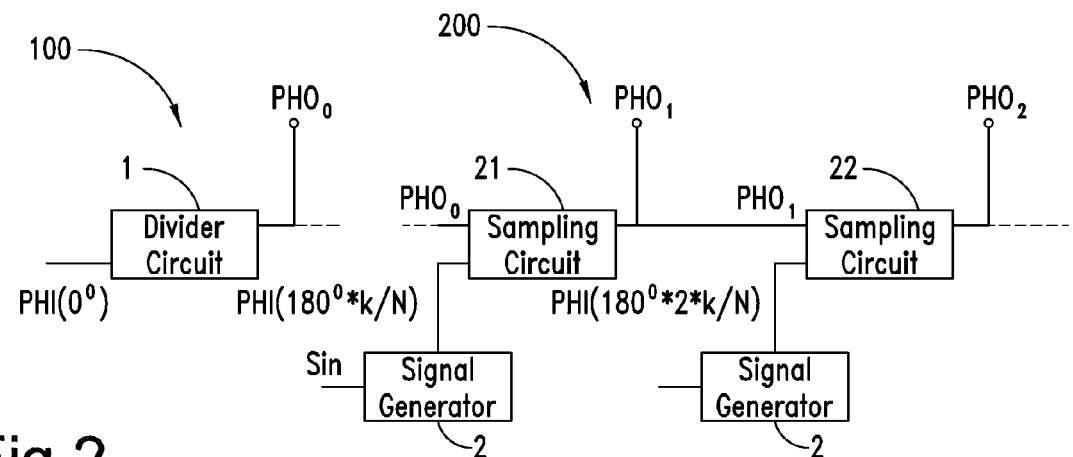
FIG. 2 shows in more detail the multiphase signal divider of FIG. 1 in accordance with a first embodiment of the disclosure.

A more detailed schematic of the divider of FIG. 1 is shown in FIG. 2 in accordance with an embodiment of the disclosure.

The divider 100 includes a plurality of N−1 devices 200, preferably flip-flops, of which the first device 21 is adapted to receive at the input the signal $PHO_0$ at the output of the divider circuit 1 and sample it by means of the signal PHI(180°*K/N) obtaining the signal $PHO_1$=PHO(180°/N) at the output. The second device 22 is adapted to receive at the input the signal $PHO_1$ at the output of the first device 21 and sample it by means of the signal PHI(180°*2K/N) obtaining the signal $PHO_1$=PHO(180°*2/N) at the output and so on.

The signal at the input of the $i^{th}$ device of the plurality of devices 200 generally has the signal $PHO_{i-1}$ at the input, i ranging from 1 to N−1, which is sampled by means of the signal PHI(180°*i*K/N) obtaining the signal $PHO_i$. Signals PHI(180°*i*K/N), i ranging from 1 to N−1, are sent to the input of the $i^{th}$ flip-flop by means of a device signal generator 2 having the multiphase signal Sin at the input and adapted to generate the signals PHI(180°*i*K/N).

Figure 3:
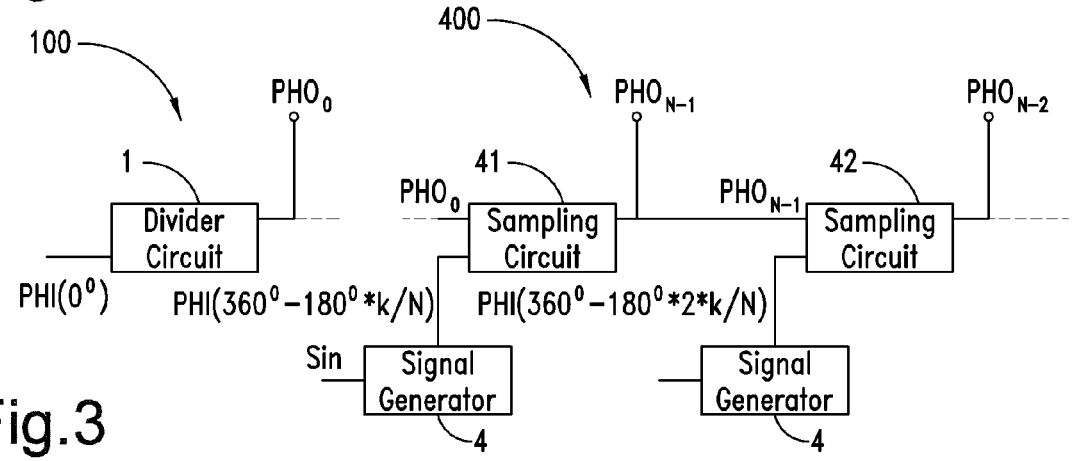
FIG. 3 shows in more detail the multiphase signal divider of FIG. 1 in accordance with a variation of the first embodiment of the disclosure.

FIG. 3 shows a multiphase signal divider 100 in accordance with a variation of the embodiment of the present disclosure. The divider 100 includes the first circuit 1 adapted to divide the first signal PHI of the plurality of signals forming the multiphase signal Sin by a constant K obtaining the signal $PHO_0$=PHO(0°), which is the first signal of the plurality of signals forming the output multiphase signal Sout.

The divider 100 has a plurality of N−1 devices 400 of which the first device 41 is adapted to receive at the input the signal $PHO_0$ at the output of the divider means 1 and sample it by means of the signal PHI(360°−180°*K/N) obtaining the signal $PHO_{n-1}$=PHO(180°*(N−1)/N) at the output. The second device 42 is adapted to receive at the input the signal $PHO_{N-1}$ at the output of the first device 41 and sample it by means of the signal PHI(360°−180°*2K/N) obtaining the signal $PHO_{N-2}$=PHO(180°*(N−2)/N) at the output and so on.

The signal at the input of the $i^{th}$ means, with i different from 1, of the plurality of means 400 generally has at the input the signal $PHO_{n-(i-1)}$, i ranging from 1 to N−1, which is sampled by means of the signal PHI(360°−180°*i*K/N) obtaining the signal $PHO_{n-1}$. Signals PHI(360°−180°*i*K/N), i ranging from 1 to N−1, are sent at the input of the $i^{th}$ flip-flop by means of a specific device 4 having the multiphase signal Sin at the input and adapted to generate the signals PHI(360°−180°*i*K/N).

Figure 4:
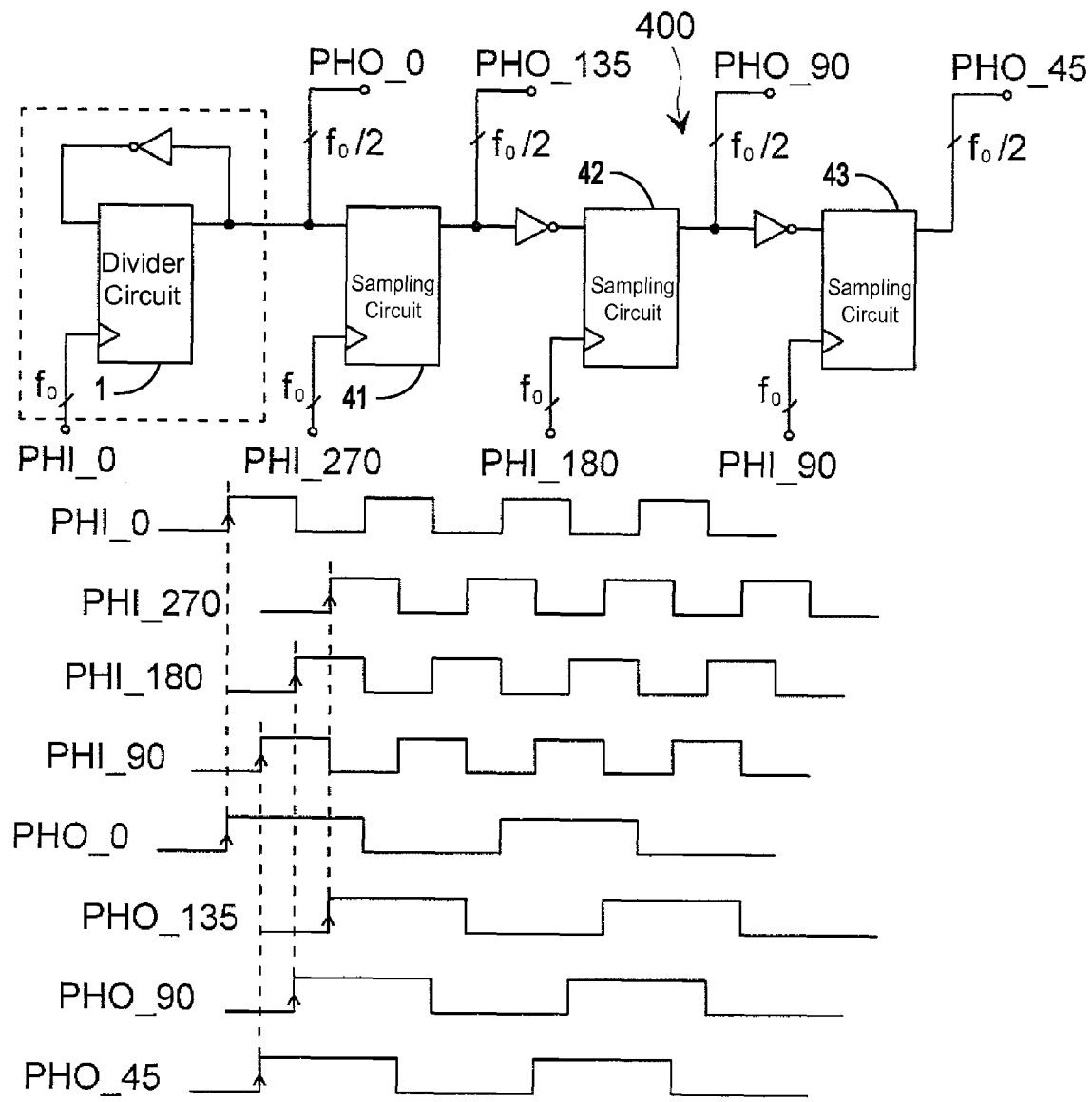
FIGS. 4 and 5 show applications of the divider in accordance with the disclosure.
Figure 5:
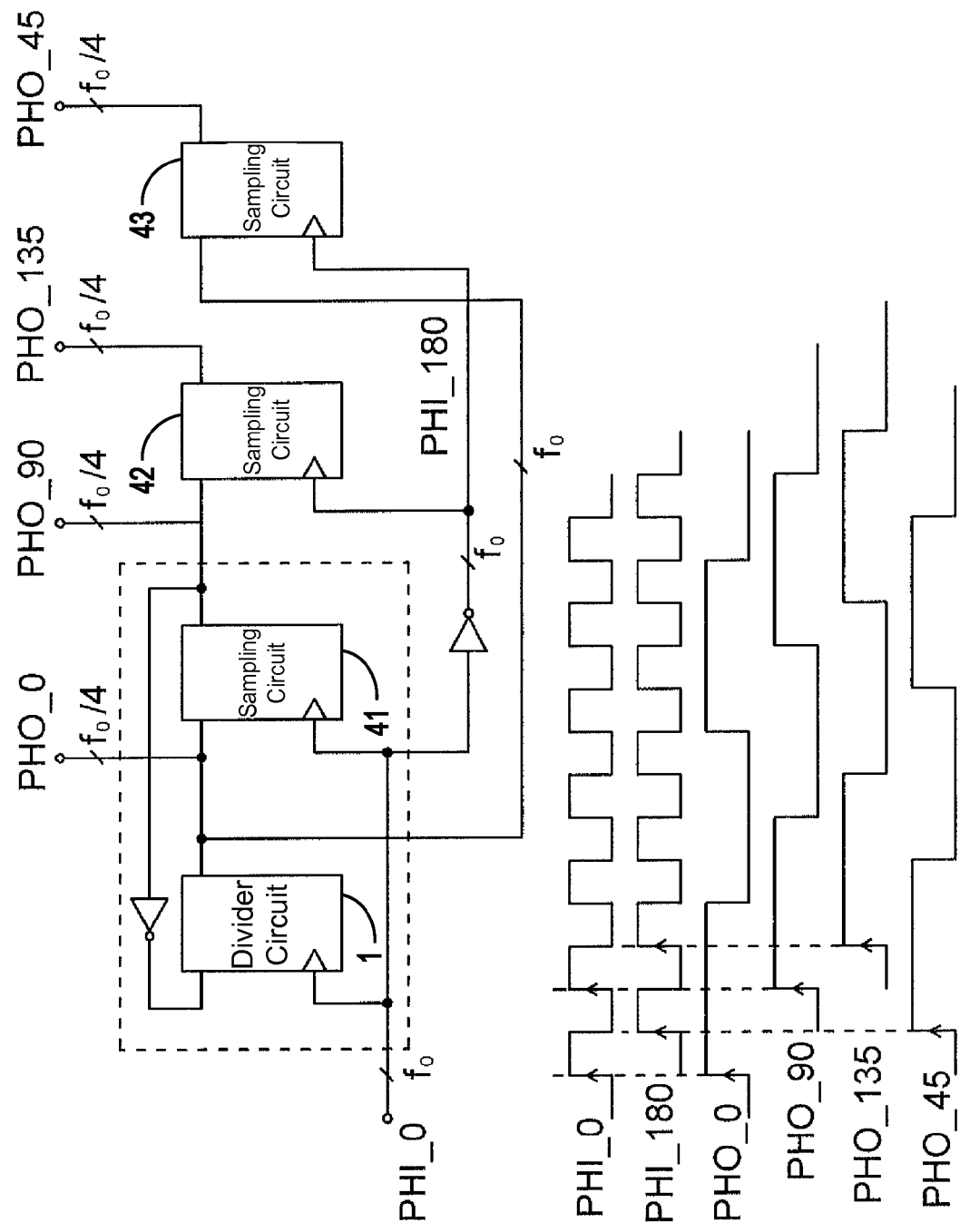

FIGS. 4 and 5 show the divider for a multiphase signal in accordance with the disclosure with N=4 and K=2 (FIG. 4) and with N=4 and K=4 (FIG. 5). The divider of FIG. 1 shows how the generation of four signal components of the output multiphase signal Sout at a frequency of $f_o/2$ is possible. The divider circuit 1 consists of a flip-flop of the toggle type having the signal PHI(0°) component at the input and being adapted to generate the signal PHO(0°). The flip-flop 41 is adapted to sample the signal PHO(0°) by means of the signal PHI(270°), the flip-flop 42 is adapted to sample the denied signal PHO(135°) by means of the signal PHI(180°), and the flip-flop 43 is adapted to sample the denied signal PHO(90°) by means of the signal PHI(90°) obtaining the signal PHO (45°). All the flip-flops must have the same load condition. The other components of the multiphase signal, required to complete the phase rotation, may simply be obtained by inverting the signals PHO(0°), PHO(45°), PHO(90°), and PHO(135°).

Figure 6:
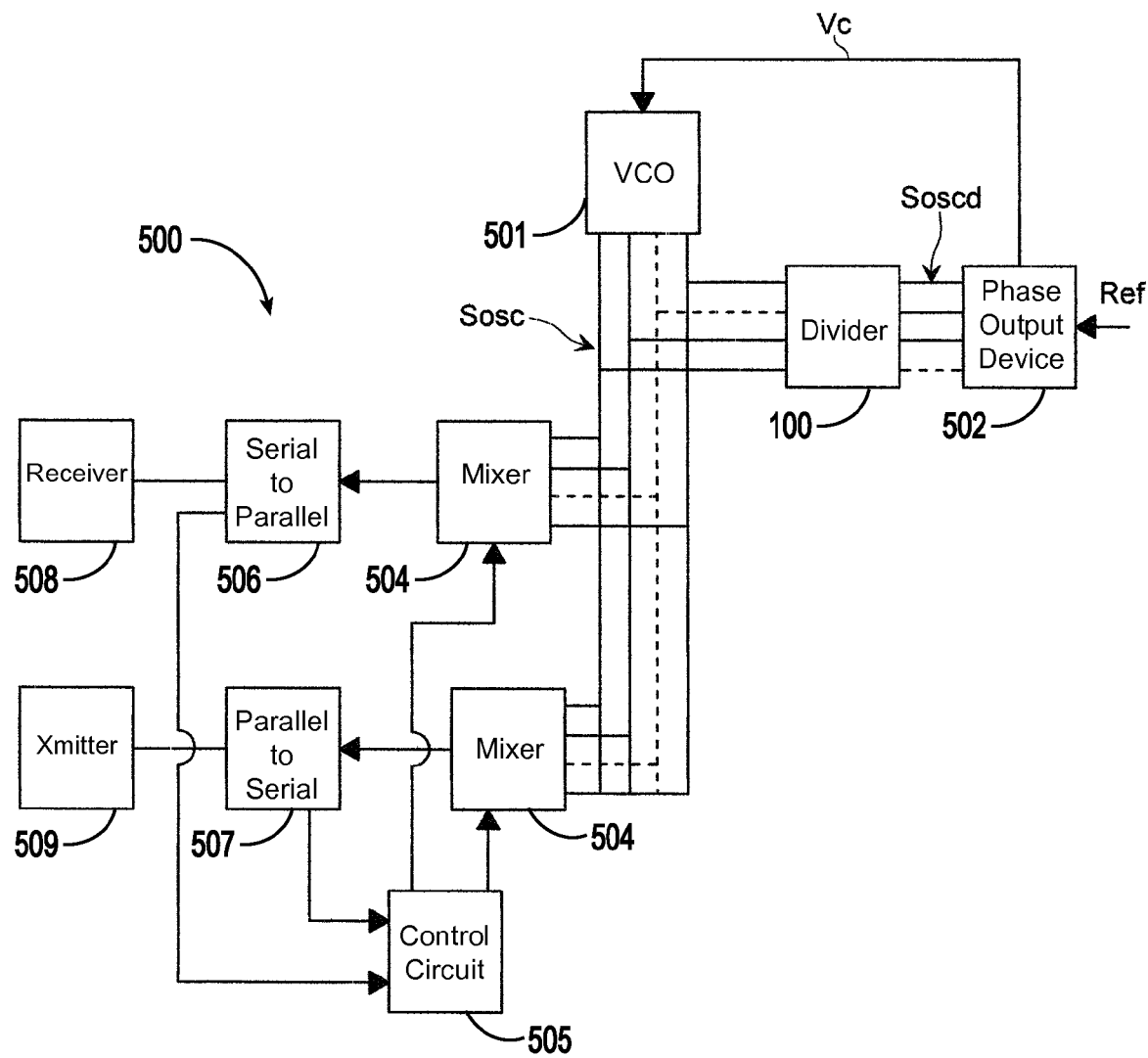
FIG. 6 shows a data transmission and reception system comprising the multiphase signal divider in accordance with the present disclosure.

FIG. 6 shows an application of the multiphase divider in accordance with the present disclosure. The system of FIG. 6 includes a phase locked loop or PLL 500 comprising a voltage controlled oscillator or VCO 501 adapted to generate a multiphase signal Sosc, a divider 100 of the multiphase signal Sosc in accordance with the disclosure adapted to divide the multiphase signal Sosc by a constant K, thus obtaining a multiphase signal Soscd of frequency $f_o/K$, a phase rotating device 502 having at the input the signals at the output of the phase divider and a reference signal Ref, and being adapted to generate a control signal Vc of the VCO oscillator 501. The system includes phase mixers 504, controlled by an appropriate device 505, having the multiphase signal Sosc at the input and the output signal of which is sent to devices 506, 507. The latter are adapted to turn the input serial data into output parallel data or vice versa and are directly connected to a receiver 508 and a transmitter 509.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A divider, comprising:
one or more input terminals configured to receive an input multiphase signal having a plurality of N signal components, with N an integer number and different from zero, at a first frequency and wherein every signal component of the plurality of signal components is phase shifted either with respect to the preceding component or the following component of the plurality of N signal components by a constant factor;
one or more output terminals configured to provide an output multiphase signal having a plurality of N signal components corresponding to the N signal components of the input multiphase signal but at a second frequency given by the first frequency divided by a division factor;
a division circuit having a first input terminal, a second input terminal, and an output terminal, the first input terminal being configured to receive a first component of the input multiphase signal, the division circuit being configured to divide the first component of the input multiphase signal by the division factor and generate on the output terminal a first component of the output multiphase signal at the second frequency;
a plurality of N−1 devices, a first device of the plurality of N−1 devices having an input terminal and an output terminal, the input terminal of the first device being coupled to the output terminal of the division circuit, the first device being configured to sample the first component of the output multiphase signal with a component of the input multiphase signal and generate on the output terminal a second component of the output multiphase signal corresponding to the component of the input multiphase signal sampled with the first device, every other device of the plurality of N−1 devices being configured to sample a component of the output multiphase signal of a preceding device of the N−1 devices with a further component of the input multiphase signal that is phase shifted by a further constant factor with respect to the component of the input multiphase signal used in the preceding device, thus obtaining another component of the output multiphase signal corresponding to the further component of the input multiphase signal, and wherein every signal component of the plurality of N signal components of the output multiphase signal is phase shifted either with respect to the preceding component or the following component of the plurality of N signal components of the output multiphase signal by the constant factor; and
an inverter electrically coupled between the second input terminal of the division circuit and either the output terminal of the division circuit or the output terminal of the first device of the plurality of N−1 devices.

2. The divider of claim 1 wherein the further constant factor is an absolute value proportional to the constant factor divided by N multiplied by 180°.

3. The divider of claim 2 wherein the first device of the plurality of N−1 devices is adapted to sample the first component of the output multiphase signal with a second component of the input multiphase signal to obtain a second component of the output multiphase signal, every other $i^{th}$ device of the plurality of N−1 devices, i being an integer number ranging from 1 to N−1, is configured to sample a component of the output multiphase signal of the preceding device with the $i^{th}$ component of the input multiphase signal, phase shifted by another constant factor with respect to a component of the input multiphase signal used in the preceding device to obtain a corresponding $i^{th}$ component of the output multiphase signal.

4. The divider of claim 2 wherein the first device of the plurality of N−1 devices is adapted to sample the first component of the output multiphase signal with a last component of the input multiphase signal to obtain a corresponding last component of the output multiphase signal, every other $i^{th}$ device of the plurality of N−1 devices, i being an integer number ranging from 1 to N−1, is configured to sample the component of the output multiphase signal of the preceding device with the $(N-i)^{th}$ component of the input multiphase signal, phase shifted by another constant factor with respect to the component of the input multiphase signal used in the preceding device to obtain a corresponding $(N-i)^{th}$ component of the output multiphase signal.

5. The divider of claim 1 wherein every device of the plurality of N−1 devices is a flip-flop of the D type.

6. A phase locked loop circuit, comprising:
a voltage controlled oscillator configured to generate a multiphase signal;
a multiphase signal divider having an input coupled to the voltage controlled oscillator and configured to receive the multiphase signal from the voltage controlled oscillator as an input multiphase signal, the multiphase signal divider further having an output and further configured to output a divided output multiphase signal on the output, the multiphase signal divider configured to divide the input multiphase signal by a constant factor, the multiphase signal divider comprising:
a division circuit having a first input terminal, a second input terminal, and an output terminal, the first input terminal coupled to the voltage controlled oscillator and configured to receive to divide a first component of the input multiphase signal by the constant factor and to generate on the output terminal a first component of the output multiphase signal; and
a plurality of N−1 devices, a first device of the plurality of N−1 devices having an input terminal and an output terminal, the input terminal coupled to the division circuit and configured to sample the first component of the output multiphase signal with a component of the input multiphase signal and to generate on the output terminal a component of the output multiphase signal corresponding to the component of the input multiphase signal, every other device of the plurality of N−1 devices adapted to sample a component of the output multiphase signal of a preceding device of the plurality of N−1 devices with a further component of the input multiphase signal, phase shifted by a further constant factor with respect to the component of the input multiphase signal used in the preceding device, thus obtaining another component of the output multiphase signal corresponding to the further component of the input multiphase signal; and an inverter circuit electrically coupled between the second input terminal of the division circuit and either the output terminal of the division circuit or the output terminal of the first device; and a phase rotating device having an input terminal and configured to receive the output multiphase signal from the output of the multiphase signal divider and configured to generate a control signal on an output terminal for the voltage controlled oscillator.

7. The phase locked loop circuit of claim 6 wherein the further constant factor is an absolute value proportional to the constant factor divided by N multiplied by 180°.

8. The phase locked loop circuit of claim 6 wherein the first device of the plurality of N−1 devices is adapted to sample the first component of the output multiphase signal with a second component of the input multiphase signal thus obtaining a second component of the output multiphase signal, every other $i^{th}$ device of the plurality of N−1 devices, i being an integer number ranging from 1 to N−1, configured to sample a component of the output multiphase signal of the preceding device with the $i^{th}$ component of the input multiphase signal, phase shifted by a further constant factor with respect to the component of the input multiphase signal used in the preceding device, thus obtaining the corresponding $i^{th}$ component of the output multiphase signal.

9. The phase locked loop circuit of claim 6 wherein the first device of the plurality of N−1 devices is adapted to sample the first component of the output multiphase signal with a last component of the input multiphase signal to obtain a corresponding last component of the output multiphase signal, every other $i^{th}$ device of the plurality of N−1 devices, i being an integer number ranging from 1 to N−1, configured to sample a component of the output multiphase signal of the preceding device with the $(N-i)^{th}$ component of the input multiphase signal, phase shifted by a further constant factor with respect to a component of the input multiphase signal used in the preceding device, to obtain a corresponding $(N-i)^{th}$ component of the output multiphase signal.

10. A circuit, comprising:
a multiphase signal divider having an input configured to receive a multiphase input signal and adapted to output a multiphase output signal, the multiphase input signal comprised of a plurality of individual signal components, the divider structured to phase shift each individual signal component relative to the other individual signal components generate a multiphase output signal formed of the plurality of phase shifted individual signal components having equal waveforms shifted by a monotonic phase shift of a constant factor, the divider including a first circuit having first and second input terminals and an output terminal, the divider configured to receive a component of the multiphase input signal on the first input terminal and to generate on the output terminal a component of the multiphase output signal, the first circuit further configured to receive on the second input terminal a component of the multiphase output signal; and an inverter circuit electrically coupled between the second input terminal of the divider and either an output terminal of the divider or the output terminal of the first circuit.

11. The circuit of claim 10 wherein the divider is configured to provide a different frequency for each of the phase shifted individual signal components.

12. The circuit of claim 10 wherein the divider is configured to divide a first signal of the plurality of individual signal components in the multiphase input signal by a constant factor to obtain a first signal of the plurality of signals, the divider further including a plurality of flip flops with a first flip flop configured to sample the first signal of the plurality of phase shifted individual signal components, and every other flip flop of the plurality of flip flops adapted to sample a respective one of the plurality of phase shifted individual signal components from a preceding flip flop and to phase shift the same by a further constant factor with respect to the individual signal component of the corresponding multiphase input signal in the preceding flip flop to obtain another phase shifted individual signal component.

13. The circuit of claim 12, further comprising a voltage controlled oscillator configured to generate the multiphase input signal to the divider, and a phase rotating circuit having an input terminal and configured to receive the multiphase output signal and a reference signal and to generate a control signal for the voltage controlled oscillator.

14. The circuit of claim 13, further including:
a plurality of phase mixers coupled to the voltage controlled oscillator, the plurality of phase mixers configured to receive the multiphase input signal and to generate an output signal;
a control circuit coupled to the plurality of phase mixers and configured to control operation of the plurality of phase mixers;
an output circuit coupled to the control circuit and to the plurality of phase mixers and configured to convert input serial data into output parallel data or vice versa; and
a receiver and a transmitter coupled to the output circuit.

* * * * *